(12) United States Patent
Rosenberg et al.

(10) Patent No.: US 6,538,793 B2
(45) Date of Patent: Mar. 25, 2003

(54) ELECTRONICALLY TUNABLE AND MODULATABLE QUASI-OPTIC GRID OSCILLATOR

(75) Inventors: James J. Rosenberg, Monrovia, CA (US); Blythe C. Deckman, Corona, CA (US); David B. Rutledge, Pasadena, CA (US)

(73) Assignee: California Institute of Technology, Pasadena, CA (US)

( * ) Notice: Subject to any disclaimer, the term of this patent is extended or adjusted under 35 U.S.C. 154(b) by 68 days.

(21) Appl. No.: 09/876,211

(22) Filed: Jun. 5, 2001

(65) Prior Publication Data

US 2002/0018282 A1 Feb. 14, 2002

Related U.S. Application Data

(60) Provisional application No. 60/211,252, filed on Jun. 13, 2000.

(51) Int. Cl.[7] .................................................. G02F 1/01
(52) U.S. Cl. ...................... 359/276; 359/278; 359/279; 359/333; 331/155
(58) Field of Search ................................. 359/276, 278, 359/279, 333; 331/155

(56) References Cited

U.S. PATENT DOCUMENTS

| | | | | |
|---|---|---|---|---|
| 5,214,394 A | * | 5/1993 | Wong ......................... | 330/286 |
| 5,317,173 A | * | 5/1994 | Sovero ....................... | 257/197 |
| 5,392,152 A | * | 2/1995 | Higgins et al. ............. | 330/286 |
| 5,450,041 A | * | 9/1995 | Halladay et al. .......... | 331/107 DP |
| 5,481,223 A | * | 1/1996 | Wong ........................ | 330/124 R |
| 5,900,965 A | * | 5/1999 | Matkin et al. .............. | 356/445 |

OTHER PUBLICATIONS

Weikle, Robert M. II "Quasi–Optical Grid Amplifiers and Oscillators" This paper appears in: 'Signals, Systems, and Electronics, 1995. ISSSE '9 Proceedings., 1995 URSI International Symposium, page(s): 103–106, Oct. 25–27, 1995'.*

Sun et al., "Varactor–controlled HFET oscillator grids" This paper appears in: 'Antennas and Propagation Society International Symposium, 1997. IEEE., 1997 Digest, page(s): 2460–2463, vol. 4, Jul. 13–18, 1997'.*

Deckman et al., "A 1 Watt, 38 GHz Monolithic Grid Oscillator", This paper appears in: 'Microwave Symposium Digest, 2001 IEEE MTT–S International, pp. 1843–1845, vol. 3, May 20–25, 2001'.*

International Search Report; PCT Application No. PCT/US01/18479; mailed Oct. 23, 2001.

Lecuyer, F., et al., "A 16–Element Reflection Grid Amplifier," *IEEE Microwave Theory and Techniques*, pp 809–812, 2000.

Bae, J., et al., "Design of a quasi–optical oscillator using a grooved mirror with a HEMT array," *IEICE Trans. on Electronics*, E81C: (6), pp. 856–861, Jun. 1998.

Chireix, H., "High Power Outphasing Modulation," *Proc. IRE* vol. 23, No. 11, pp. 1370–1392, Nov. 1935.

Kim, M., et al., "A 6.5 GHz 11.5 GHz Source Using a Grid Amplifier with a Twist Reflector," *IEEE Transactions on Microwave Theory and Techniques*, vo. 41, No. 10, pp. 1772–1774, Oct. 1993.

(List continued on next page.)

*Primary Examiner*—Michael Tokar
*Assistant Examiner*—Khai Nguyen
(74) *Attorney, Agent, or Firm*—Fish & Richardson P.C.

(57) ABSTRACT

The present invention discloses an electronically frequency tunable and phase modulatable quasi-optic grid oscillator. The oscillator includes a reference signal input port whereby a small external reference signal is introduced that entrains the frequency and phase of the oscillator signal to it. Amplitude modulation techniques are introduced to further enhance the utility of the oscillator as a modulator.

17 Claims, 6 Drawing Sheets

OTHER PUBLICATIONS

Kiyokawa, M., et al., "A New Quasi–Oscillator With Gaussian Output Beam," *IEEE Microwave and Guided Wave Letters,* vol. 4, No. 5, pp., 129–131, May 1994.

Kondo, H., et al., "Millimeter and Submillimeter Wave Quasi–Optical Oscillator With Multi–Elements," *IEEE Transactions on Microwave Theory and Techniques,* vol. 40, No. 5, pp. 857–863, May 1992.

Mader, T., et al., "Quasi–Optical VCOs," *IEEE Transactions on Microwave Theory and Techniques,* vol. 41, No. 10, pp. 1775–1781, Oct. 1993.

Sun, Q., et al., "Grid Oscillators With Selective–Feedback Mirrors," *IEEE Transactions on Microwave Theory and Techniques,* vol. 46, No. 12, pp. 2324–2329, Dec., 1998.

* cited by examiner

ELECTRONICALLY TUNABLE AND MODULATABLE QUASI-OPTIC GRID OSCILLATOR

This application claims the benefit of provisional application No. 60/211,252, filed Jun. 13, 2000.

STATEMENT AS TO FEDERALLY SPONSORED RESEARCH

The U.S. Government may have certain rights in this invention pursuant to ARO Grant No. DAA G55-98-1-0001 awarded by the U.S. Army and ONR Grant No. N66 001-96-C-8627.

BACKGROUND OF THE INVENTION

1. Field of the Invention

This invention relates to quasi-optic grid arrays, and in particular to tunable and modulatable grid oscillators.

2. Description of Related Art

Broadband communications, radar and other imaging systems require the transmission of radio frequency ("RF") signals in the microwave and millimeter wave bands. In order to efficiently achieve the levels of output transmission power needed for many applications at these high frequencies, a technique called "power combining" has been employed, whereby the output power of individual components are coupled, or combined, thereby creating a single power output that is greater than an individual component can supply. Conventionally, power combining has used resonant waveguide cavities or transmission-line feed networks. These approaches, however, have a number of shortcomings that become especially apparent at higher frequencies. First, conductor losses in the waveguide walls or transmission lines tend to increase with frequency, eventually limiting the combining efficiency. Second, these resonant waveguide cavities or transmission-line combiners become increasingly difficult to machine as the wavelength gets smaller. Third, in waveguide systems, each device often must be inserted and tuned manually. This is labor-intensive and only practical for a relatively small number of devices.

Several years ago, spatial power combining using "quasi-optics" was proposed as a potential solution to these problems. The theory was that an array of microwave or millimeter-wave solid state sources placed in a resonator could synchronize to the same frequency and phase, and their outputs would combine in free space, minimizing conductor losses. Furthermore, a planar array could be fabricated monolithically and at shorter wavelengths, thereby enabling potentially thousands of devices to be incorporated on a single wafer.

Since then, numerous quasi-optical devices have been developed, including detectors, multipliers, mixers, and phase shifters. These passive devices continue to be the subject of ongoing research. Over the past few years, however, active quasi-optical devices, namely oscillators and amplifiers, have evolved. One benefit of spatial power combining (over other methods) using quasi-optics is that the output power scales linearly with chip area. Thus, the field of active quasi-optics has attracted considerable attention in a short time, and the growth of the field has been explosive.

It is believed that the first quasi-optical grid array amplifier was developed by M. Kim et al. at the California Institute of Technology. This grid used 25 MESFET differential pairs, demonstrating a gain of 11 dB at 3 GHz. As shown in FIG. 1, a typical grid amplifier 10 is an array of closely-spaced differential pairs of transistors 14 on an active grid 12 sandwiched between an input and output polarizer, 18, 24. An input signal 16 passes through the horizontally polarized input polarizer 18 and creates an input beam incident from the left that excites rf currents on the horizontally polarized input antennas 20 of the grid 12. These currents drive the inputs of the transistor pair 14 in the differential mode. The output currents are redirected along the grid's vertically polarized antennas 22, producing a vertically polarized output beam 30 via an output polarizer 24 to the right.

The cross-polarized input and output affords two important advantages. First, it provides good input-output isolation, reducing the potential for spurious feedback oscillations. Second, the amplifier's input and output circuits can be independently tuned using metal-strip polarizers, which also confine the beam to the forward direction. Numerous grid amplifiers have since been developed and have proven thus far to have great promise for both military and commercial RF applications and particularly for high frequency, broadband systems that require significant output power levels (e.g. >5 watts) in a small, preferably monolithic, package. Moreover, a resonator can be used to provide feedback to couple the active devices to form a high power oscillator.

One non-modulatable source configuration, known as a "Kim oscillator," is described in M. Kim, E. A. Sovero, J. B. Hacker, M. P. De Lisio, J. J. Rosenberg, D. B. Rutledge, "A 6.5 GHz–11.5 GHz Source Using a Grid Amplifier with a Twist Reflector," *IEEE Trans. on Microwave Theory and Tech.*, Vol. 41, No. 10, pp. 1772–1774, October, 1993. The basic concept of this oscillator is to apply external feedback to a grid amplifier in order to induce it to oscillate. FIG. 2A shows a functional schematic of the standard Kim oscillator disclosed therein. FIG. 2B shows an exploded view of the physical configuration of a standard Kim oscillator. As seen, a twist reflector 40, comprising a tilted polarizer 42 and a mirror 44 rotates the y-polarization of the portion of the amplified output beam from the amplifier 46 that is incident upon it and reflects it back into the input of grid amplifier. The polarizer 42 of the twist reflector 40 can be treated as a perfect reflector to energy polarized along its wires and as invisible to energy polarized perpendicular to them. The grid amplifier active array provides gain and gain compression. The frequency selectivity (tuning) in the feedback is accomplished by a phase delay 41, which is primarily set by the physical separation "d" of the twist reflector and the grid array. The output polarizer 48 provides both isolation of the output from the input polarization as well as providing impedance matching for the input polarization.

Another type of grid oscillator is a voltage controlled quasi-optical oscillator, disclosed by T. Mader, S. Bundy, Z. B. Popovic, "Quasi-Optical VCOs," *IEEE Trans. on Microwave Theory and Tech.*, Vol. 41, No. 10, pp. 1775–1781, October, 1993. Unfortunately, this VCO, while tunable, produces relatively little output power and has a fairly narrow tuning range.

Grid oscillators that include an external twist-reflector feedback network ("Kim oscillators") are conventionally frequency tuned by mechanically translating the feedback network along the axis of the grid's transmitted beam. Unfortunately, the need to physically move the reflector to tune the device is undesirable for numerous reasons. The addition of translation means adds bulk and expense to these otherwise highly reproducible structures. Mechanical tuning can be imprecise and slow. Further, the oscillator cannot modulate its output signal. Thus, such devices are impractical for most applications.

Electronic tuning of grid oscillators having twist reflectors has been proposed as a possible solution. One solution entails introducing a varactor-loaded tilted filter structure in place of the tilted polarizer in the twist reflector. This solution should allow direct phase modulation of the grid oscillator, but requires a specialized processing unit to generate the modulation signals to be applied to the varactors, and a specialized high-speed amplifier to actually drive the varactors. These extra components can add cost and complexity to the oscillator. Thus, there is a definite need for a tunable and modulatable grid oscillator that does not require such specialized circuitry.

SUMMARY OF THE INVENTION

The present invention, which addresses this need resides in an electronically tunable and modulatable quasi-optic power signal source. The power signal source includes a quasi-optic grid array oscillator having an output that sources an output signal, and means for introducing a signal to entrain the frequency and phase of the oscillator output to a reference signal having a frequency and phase that are specified as a function of time, such that the oscillator output bears a predetermined relationship to the frequency and phase of the reference signal. The grid array oscillator includes a grid amplifier having an input and output and a twist reflector spaced apart from the amplifier by a predetermined distance. In a preferred embodiment, the means for entraining is an input port associated with the oscillator that accepts an external injection-locking reference signal having a frequency and phase that are specified as a function of time. This electronic phase modulation described by this invention allows one to utilize signals that are typically generated with conventional transmitter systems. These phase-modulated signals at either the transmission frequency (or an integral fraction thereof), are usually generated at the output of an upconverter and applied to a preamplifier (or amplifying frequency multiplier) before the final power amplification stage. This invention can be deigned into a transmitter system, thereby eliminating the need for the preamplifier (or frequency multiplier). This allows a reduction in part-count and simplification of the overall transmitter system.

The input port of the present invention may be located at any one of a number of locations in the oscillator. In one preferred embodiment, the input port is located at the twist reflector. More specifically, the twist reflector includes a mirror and an angled polarizer associated with the mirror and the input port is located within the mirror of the twist reflector. In another embodiment of the power signal source of the present invention, the input port is located at the input of the grid amplifier. In yet another embodiment, the input port is located at the output of the grid amplifier. In still yet another embodiment, the input port is located at the output of the oscillator.

The reference signal source that is applied to the reference port may take several different forms to achieve the same oscillator output. For example, in, one embodiment, the output of the oscillator tracks the frequency and phase of the reference signal in a one to one relationship. That is, the frequency and phase of the oscillator output is substantially the same as the frequency and phase of the input reference signal at the reference port. Alternatively, the frequency and phase of the oscillator's output may be a multiple of the frequency and phase of the reference signal.

In another aspect of the present invention, an electronically tunable and modulatable quasi-optic power signal source is disclosed. The source includes a quasi-optic grid array oscillator that includes a grid amplifier, a polarizing feedback structure and an output that sources an output signal, and a reference input port associated with the oscillator that accepts an external injection-locking reference signal having a frequency and phase that are specified as a function of time such that the oscillator output bears a predetermined relationship to the frequency and phase of the reference signal.

The oscillator of the present invention may also serves an a novel amplitude modulator. In one aspect, the electronically tunable and modulatable power signal source includes a quasi-optic grid oscillator having an output that sources an output signal, a reference input port and a controller that regulates the amplitude of the output signal of the oscillator. The reference port may be located at any appropriate location on the oscillator. The port accepts an external injection-locking reference signal having a frequency and phase that are specified as a function of time such that the oscillator output bears a predetermined relationship to the frequency and phase of the reference signal. In one aspect of this invention, the means for controlling the amplitude of the output is an external voltage modulator connected to the oscillator that directly modulates of the control bias voltage of the oscillator.

In another aspect of the invention, a system for electronically tuning and modulating a power signal source is disclosed. The system includes two quasi-optic grid oscillators each having an output that sources an output signal, where the output signals are summed together. Also included is outphasing modulation control unit that supplies each of the grid oscillators with its own phase-modulated reference signal. Using this technique, called Chireix's technique, the phasor sum of the oscillators outputs a desired phase and amplitude modulated signal. In one embodiment, the outputs of the two oscillators are summed in free-space. In another, the outputs of the two oscillators are summed using guided-wave power combining.

The two amplitude modulation techniques described above may also be combined to result in a more efficient and accurate quasi-optic AM modulatable oscillator. In particular, dual oscillator system described above that employs Chireix's outphasing modulation technique may also employ direct amplitude modulation to each oscillator, such that the amplitude of the first oscillator output is directly modulated with a first external voltage modulator and the amplitude of the second oscillator output is directly modulated with a second external voltage modulator.

A method of electronically tuning and modulating a quasi-optic grid oscillator having a signal output is disclosed. The method includes applying an entraining reference signal to the oscillator and adjusting the reference signal to a desired frequency and phase such that the oscillator output bears a predetermined relationship to the frequency and phase of the reference signal.

DETAILED DESCRIPTION OF THE PREFERRED EMBODIMENTS

Figure 1:
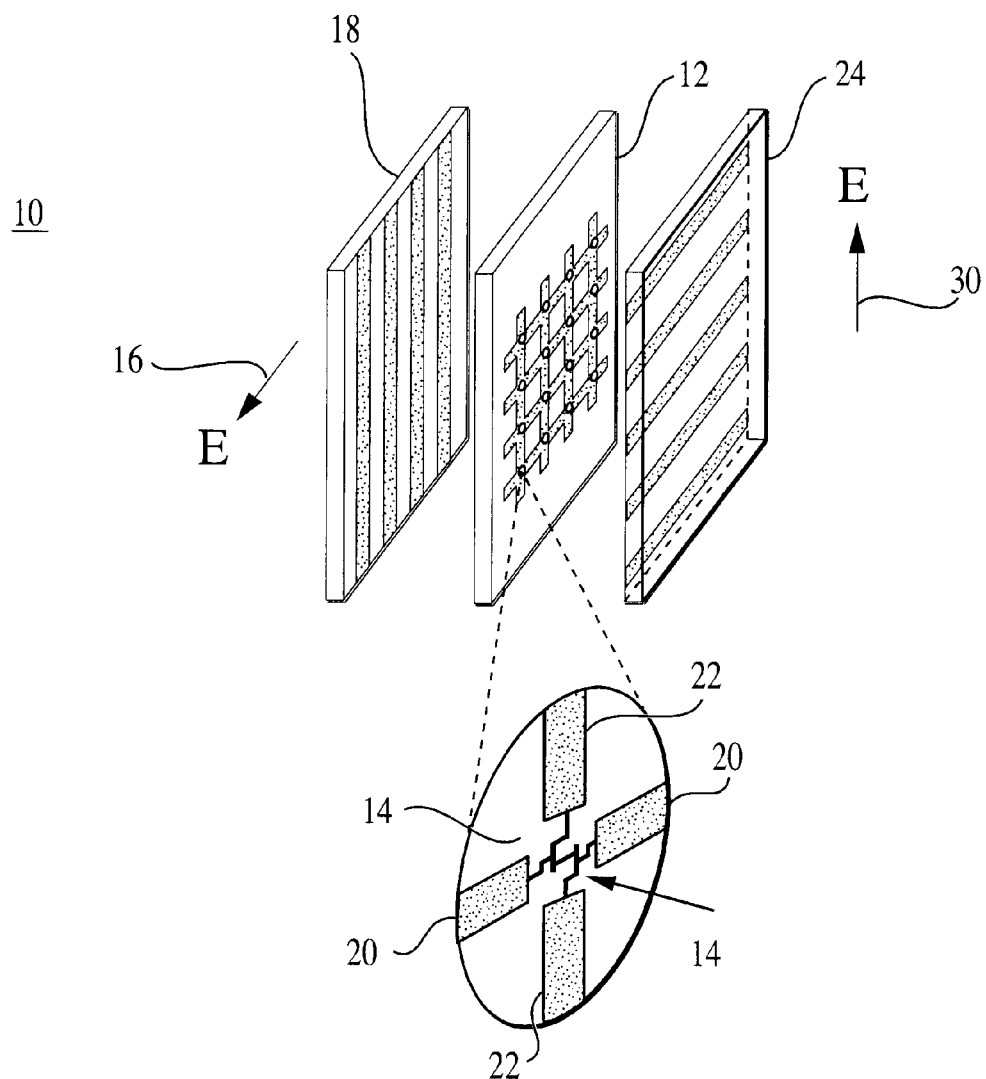
FIG. 1 is an exploded view of a conventional quasi-optic grid array with one of the differential pair unit cells in the array magnified.
Figure 2A:
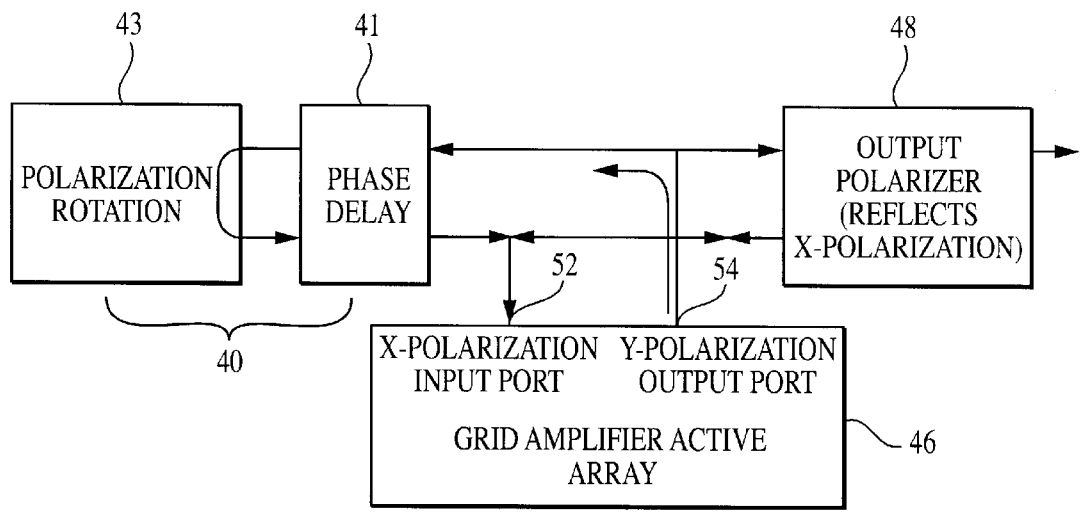
FIG. 2A is a functional schematic of a standard, quasi-optic grid array source (a "Kim oscillator")
Figure 2B:
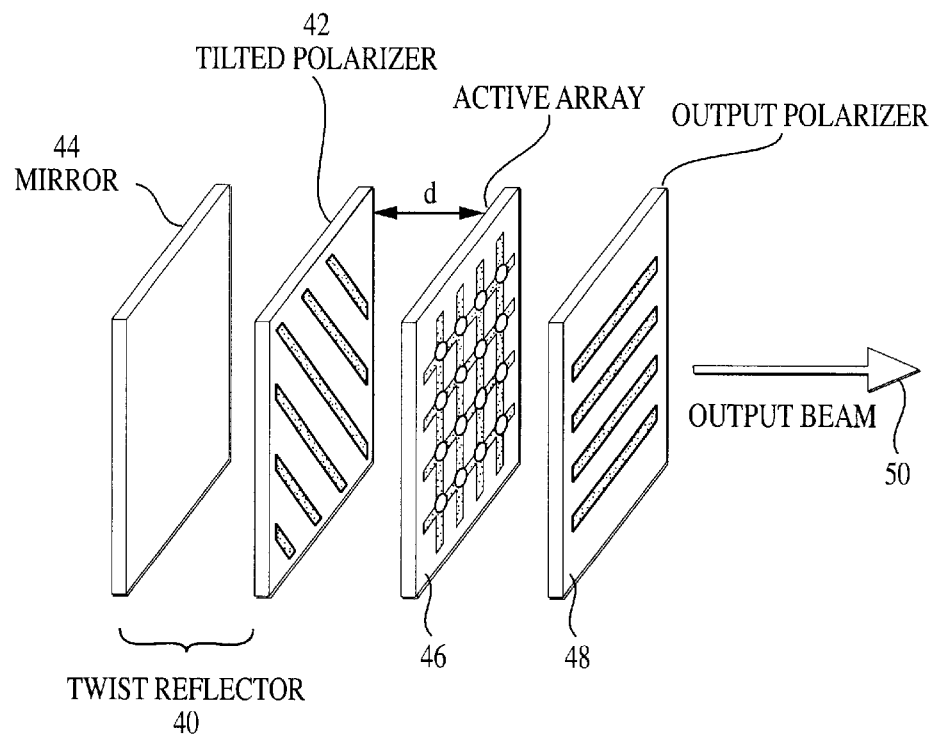
FIG. 2B shows an exploded view of the physical configuration of a standard Kim oscillator.
Figure 3:
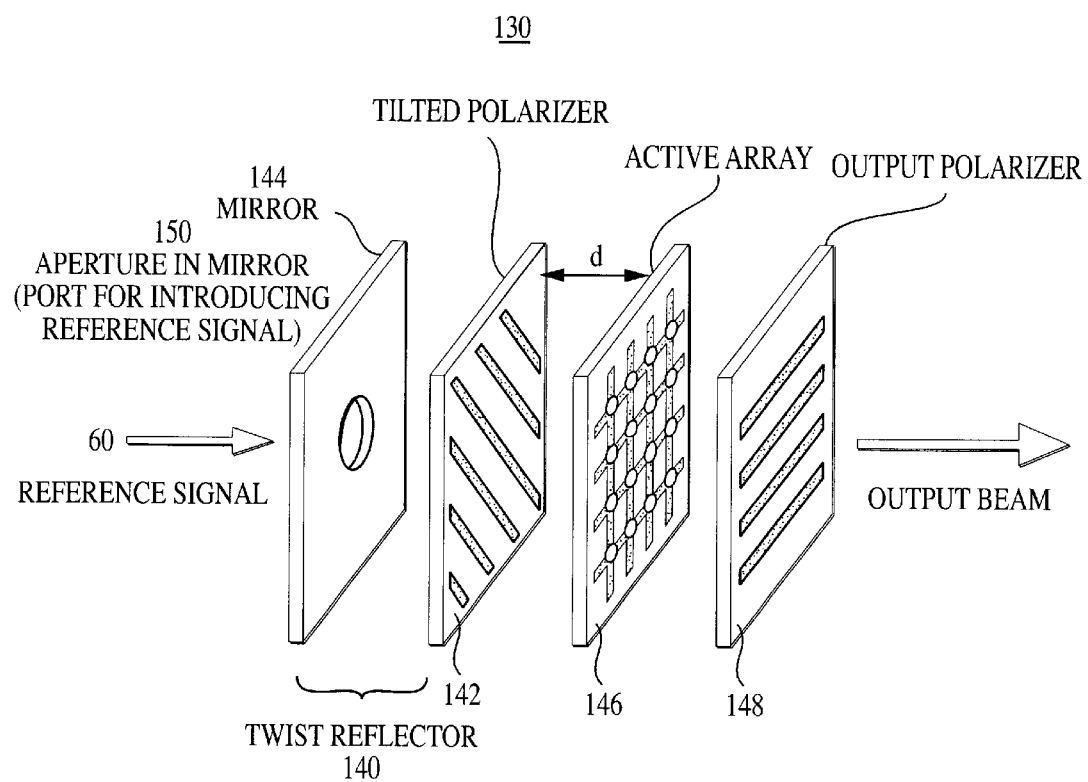
FIG. 3 shows an exploded view of the physical configuration one embodiment of the present invention, whereby the twist reflector of a conventional Kim oscillator is fitted with a reference signal input port.

The invention disclosed herein resides in a quasi-optic grid oscillator:that includes a reference input port placed at any of a variety of locations in the oscillator. FIG. 3 shows a physical implementation of one such embodiment. The Kim oscillator 130 includes an active grid array 146 sandwiched between and an output polarizer 148 and a twist reflector 140. The twist reflector comprises a mirror 144 and a tilted polarizer 142. In this embodiment, a reference signal input port 150 is bored into the mirror 144 of the twist reflector 140. A relatively small, entraining, reference signal 60 that has a time-dependent frequency and phase is simply introduced into the reference input port. As discussed below, this reference port may be located at different places in the Kim oscillator and still function in substantially the same way as the device shown in FIG. 3

Figure 4A:
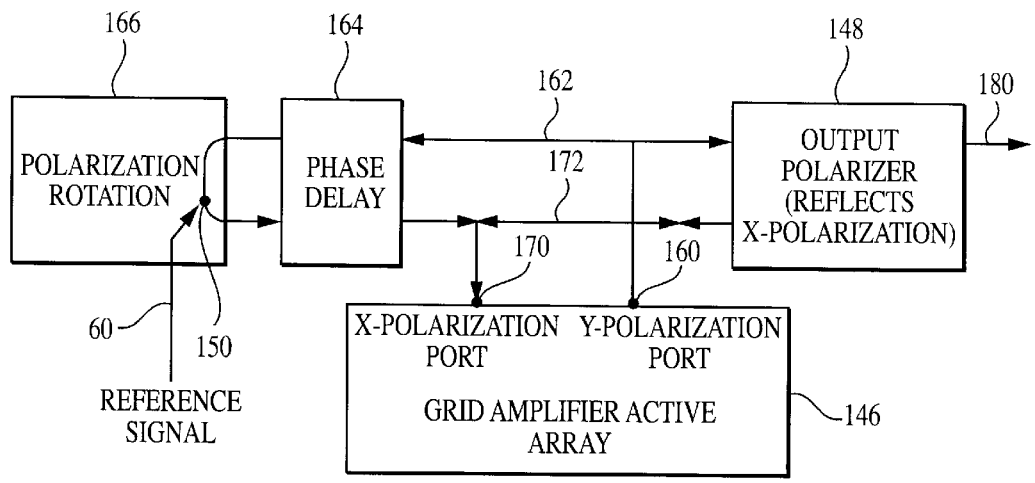
FIG. 4A is a functional schematic of one preferred embodiment of the present invention wherein the quasi-optic grid array oscillator incorporating a phase modulating scheme in which the entraining signal is introduced within the twist reflector of the active array.

FIG. 4A is a functional schematic that explains the operation of the embodiment of the invention shown in FIG. 3, wherein the quasi-optic grid array oscillator incorporates a phase modulating scheme in which an entraining signal is introduced within the twist reflector of the active array. In particular, the grid amplifier 146 generates an output signal at its output, or "y-polarization" port 160. As seen at signal path 162, a portion of the signal is received by the output polarizer 148 and a portion radiates on the twist reflector 140, which introduces a phase delay 164 and polarization rotation 166. The signal bounces off the reflector and returns as an x-polarized signal to the grid array along 172. This return signal is received at the x-polarized port 170 of the grid amplifier 146 and is blocked by the output polarizer 148. A phase modulated or frequency modulated reference signal 60 is introduced into the reference signal port 150, where in this embodiment is located within the twist reflector 40.

If the reference signal has a frequency sufficiently close to the free-running frequency that would be exhibited by the oscillator in the absence of the reference signal, the oscillator will be entrained to the reference signal 60 in both frequency and phase. In this sense the reference signal is an external injection locking signal. It should be understood that "entraining" as used herein does not necessarily mean instantaneous tracking of the reference signal. Rather, the term refers to the action whereby the oscillator's output will reach a state in which its frequency will substantially match the frequency of the reference signal and its phase will bear a substantially fixed relationship to the phase of the reference signal. Moreover, the reference signal 60 need not be at the desired output frequency, but can instead operate at an integer fraction (e.g., one half, one third) of the desired operating frequency, since the oscillator can be entrained by a harmonic of the reference signal.

An understanding of the particular oscillator dynamics, which readily obtained by one skilled in the art, would enable one to predetermine the relationship between the frequency and phase of the oscillator output and the frequency and phase of the reference signal. Knowing this predetermined relationship would thereby enable one to construct a reference signal to obtain the desired output.

Figure 4B:
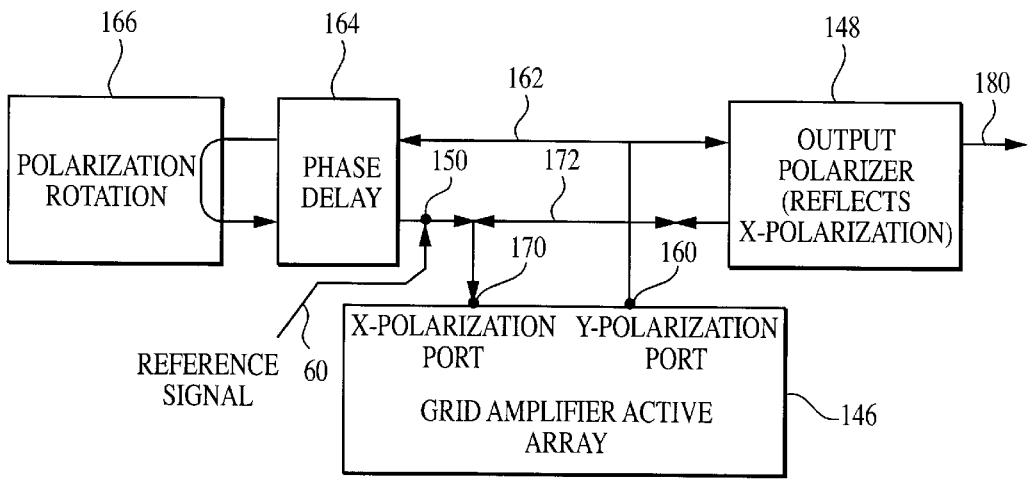
FIG. 4B is a functional schematic of one preferred embodiment of the present invention wherein the quasi-optic grid array oscillator incorporating a phase modulating scheme in which the entraining signal is introduced at the grid amplifier's input port.
Figure 4C:
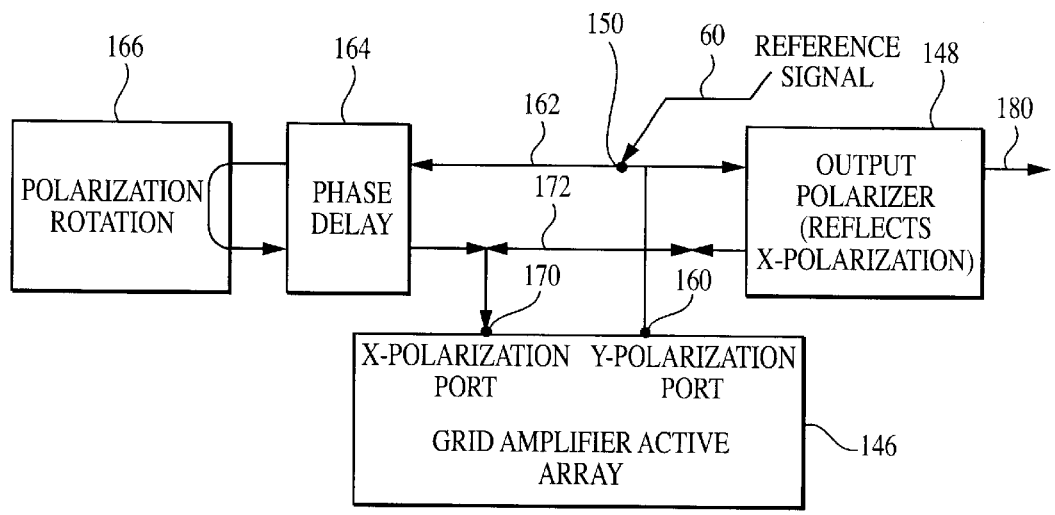
FIG. 4C is a functional schematic of one preferred embodiment of the present invention wherein the quasi-optic grid array oscillator incorporating a phase modulating scheme in which the entraining signal is introduced at the grid amplifier's output port.
Figure 4D:
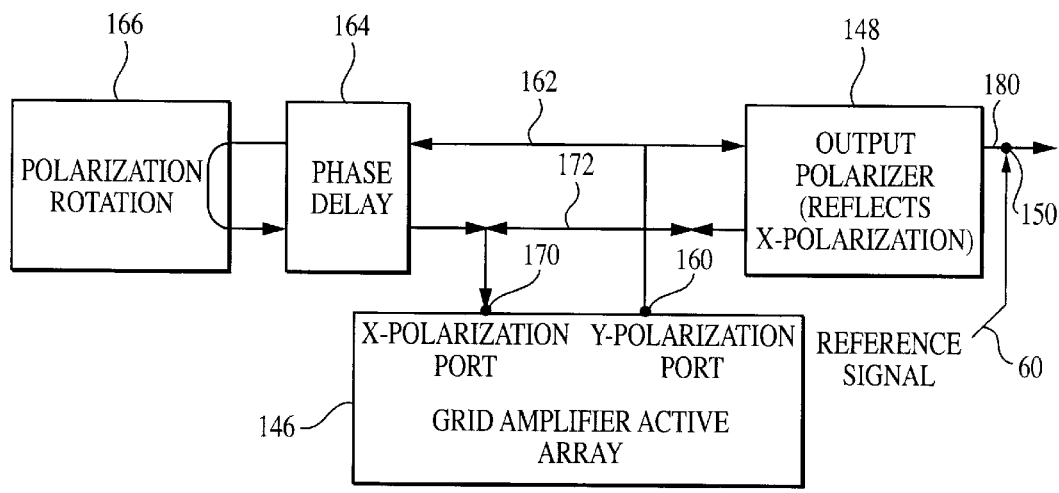
FIG. 4D is a functional schematic of one preferred embodiment of the present invention wherein the quasi-optic grid array oscillator incorporating a phase modulating scheme in which the entraining signal is introduced at the output of the oscillator.

FIGS. 4B–4D show alternative functional schematics of the frequency/phase modulation technique shown in FIG. 4A, with the reference signal being introduced at alternative points, or ports, in the oscillator. Thus, FIG. 4B shows the same schematic as FIG. 4A with reference port 150 for the reference signal 60is substantially located at the grid amplifier's 46 input port 170. FIG. 4C shows the entraining signal introduced at the amplifier's output port 160, and FIG. 4D shows the signal being introduced at the output 180 of the oscillator.

In a further embodiment of the present invention, simultaneous amplitude modulation can also be accomplished using the oscillator. Direct amplitude modulation can be accomplished through modulation of the bias voltage applied to control electrodes (e.g., gates of field effect transistors or bases of bipolar transistors) of the active devices in the array. A time-varying voltage applied to the control line connecting to the control electrodes of the individual devices will yield an amplitude modulation of the oscillator output. Synchronizing this time-varying control voltage with the phase-modulated reference signal would enable, for example, quadrature amplitude modulation (QAM).

Figure 5:
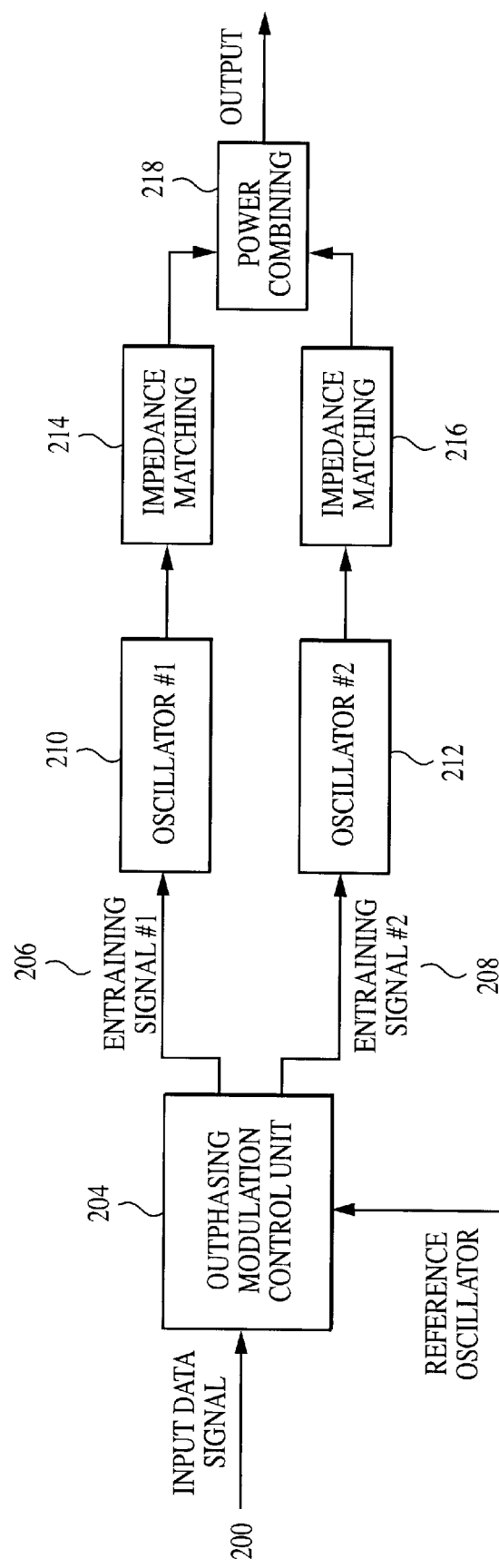
FIG. 5 a functional schematic of one embodiment of the present invention wherein outphasing modulation is applied with a plane-modulated oscillator.

In an alternative method of achieving amplitude modulation, Chireix's AM technique described in H. Chireix, "High Power Outphasing Modulation," *Proc. IRE*, vol. 23, no. 11, November 1935, pp. 1370–1392, may be used in conjunction with the phase modulation scheme illustrated in FIGS. 3 and 4A–D. The application of Chireix's technique requires the use of a pair of modulatable oscillators 210, 212 as illustrated in FIG. 5. In particular, an "outphasing modulation control unit 204 generates from a data input signal 200 and a reference oscillator 202 a pair of phase modulated signals 206, 208. These signals are applied at the signal reference ports of the two modulatable oscillators 210, 212. Consistent with Chireix's outphasing modulation technique, the two reference signals are constructed from the control unit 204 such that the resultant phasor sum of the entrained oscillator outputs is the desired phase and amplitude modulated output signal. In the invention disclosed herein, the impedance matching 214, 216 and summation functions at power combiner 218 described in detail in the above-referenced article are accomplished either quasi-optically, using quasi-optical filters and spatial power combining for the summation at 218, or using guided wave components (e.g., waveguide filters, "magic tees," orthomode transducers, or Wilkinson combiners).

It is also possible to incorporate the two amplitude modulation techniques described above simultaneously in order to improve both efficiency and phase/amplitude accuracy. The individual oscillators can be equipped with direct amplitude modulation through the control electrodes to provide two or more discrete steps in amplitude. In the simplest version, the two oscillators could be run in phase-quadrature, with each oscillator equipped with a simple on/off modulation. This can be used to generate either QPSK or 8QAM modulation. For more sophisticated modulation schemes, Chireix's outphasing modulation with two constant-amplitude phase modulated oscillators could be improved upon by operating each oscillator with two or more discrete amplitude steps. Lower amplitude overall outputs would then be derived from the phasor sum of smaller amplitude individual oscillator outputs. This would improve efficiency as well as the phase and amplitude accuracy of the low amplitude overall outputs.

Having thus described exemplary embodiments of the invention, it will be apparent that further alterations, modifications, and improvements will also occur to those skilled in the art. Further, it will be apparent that the present technique and system is not limited to use as a technique. Accordingly, the invention is defined only by the following claims.

We claim:

1. An electronically tunable and modulatable quasi-optic power signal source, comprising:
    (a) a quasi-optic grid oscillator that includes (i) a grid array amplifier having an input and output, (ii) a twist reflector spaced apart from the amplifier by a predetermined distance, and (iii) an oscillator output that sources an output signal; and
    (b) means for introducing a signal to entrain the frequency and phase of the oscillator output to a reference signal having a frequency and phase that are specified as a function of time, such that the oscillator output bears a predetermined relationship to the frequency and phase of the reference signal.

2. The power signal source of claim 1, wherein the means for entraining is an input port associated with the oscillator that accepts an external injection-locking reference signal having a frequency and phase that are specified as a function of time.

3. The power signal source of claim 2, wherein the input port is located at the twist reflector.

4. The power signal source of claim 3, wherein the twist reflector includes a mirror and an angled polarizer associated with the mirror and the input port is located within the mirror of the twist reflector.

5. The power signal source of claim 2, wherein the input port is located at the input of the grid amplifier.

6. The power signal source of claim 2, wherein the input port is located at the output of the grid amplifier.

7. The power signal source of claim 2, wherein the input port is located at the output of the oscillator.

8. The source of claim 1, wherein the output of the oscillator tracks the frequency and phase of the reference signal in a one to one relationship.

9. The source of claim 1, wherein the frequency and phase of the oscillator's output is a multiple of the frequency and phase of the reference signal.

10. An electronically tunable and modulatable quasi-optic power signal source, comprising:
    (a) a quasi-optic grid oscillator including a grid array amplifier, a polarizing feedback structure and an output that sources an output signal; and
    (b) a reference input port associated with the oscillator that accepts an external injection-locking reference signal having a frequency and phase that are specified as a function of time such that the oscillator output bears a predetermined relationship to the frequency and phase of the reference signal.

11. An electronically tunable and modulatable power signal source, comprising:
    (a) a quasi-optic grid oscillator having an output that sources an output signal;
    (b) a reference input port associated with the oscillator that accepts an external injection-locking reference signal having a frequency and phase that are specified as a function of time such that the oscillator output bears a predetermined relationship to the frequency and phase of the reference signal; and
    (c) a controller that regulates the amplitude of the output signal of the oscillator.

12. The signal source of claim 11, wherein the controller is an external voltage modulator connected to the oscillator that directly modulates of the control bias voltage of the oscillator.

13. A system for electronically tuning and modulating a power signal source, comprising:
    (a) a first quasi-optic grid oscillator having an first output that sources a first output signal;
    (b) a second quasi-optic grid oscillator having an second output that sources a second output signal that is summed with the first output; and
    (c) an outphasing modulation control unit that supplies the first and second grid oscillators with a first and second phase-modulated reference signal, respectively, such that the phasor sum of the oscillators outputs a desired phase and amplitude modulated signal.

14. The system of claim 13, wherein the outputs of the two oscillators are summed in free-space.

15. The system of claim 13, wherein the outputs of the two oscillators are summed using guided-wave power combining.

16. The array of claim 13, wherein the amplitude of the first oscillator output is directly modulated with a first external voltage modulator and the amplitude of the second oscillator output is directly modulated with a second external voltage modulator.

17. A method of electronically tuning and modulating a quasi-optic grid oscillator having a signal output, including:
    applying a reference signal to the oscillator; and
    adjusting the reference signal to a desired frequency and phase such that the oscillator output is entrained to the frequency and phase of the reference signal.

\* \* \* \* \*